United States Patent
Ströble et al.

(10) Patent No.: US 7,280,065 B2
(45) Date of Patent: Oct. 9, 2007

(54) METHOD FOR CONVERTING AN ANALOG INPUT SIGNAL, AND ANALOG-TO-DIGITAL CONVERTER

(75) Inventors: Olaf Ströble, Munich (DE); Victor da Fonte Dias, Neubiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/352,803

(22) Filed: Feb. 13, 2006

(65) Prior Publication Data

US 2006/0187104 A1 Aug. 24, 2006

Related U.S. Application Data

(63) Continuation of application No. PCT/DE04/01587, filed on Jul. 21, 2004.

(30) Foreign Application Priority Data

Aug. 12, 2003 (DE) ................ 103 37 042

(51) Int. Cl.
  *H03M 1/12* (2006.01)
(52) U.S. Cl. .................... 341/156; 341/155
(58) Field of Classification Search ........... 341/155, 341/161, 156
  See application file for complete search history.

(56) References Cited

U.S. PATENT DOCUMENTS

| | | | |
|---|---|---|---|
| 5,629,700 A * | 5/1997 | Kumamoto et al. | ........ 341/161 |
| 5,861,832 A | 1/1999 | Nagaraj | |
| 6,097,326 A * | 8/2000 | Opris et al. | .................. 341/161 |
| 6,288,662 B1 * | 9/2001 | Yoshizawa | .................. 341/155 |
| 6,369,744 B1 * | 4/2002 | Chuang | ...................... 341/161 |
| 6,480,132 B1 * | 11/2002 | Yoshioka et al. | ........... 341/155 |
| 6,501,412 B2 * | 12/2002 | Tanabe | ........................ 341/161 |
| 6,570,523 B1 | 5/2003 | Bacrania et al. | |
| 2003/0098808 A1 * | 5/2003 | Hirai | .......................... 341/155 |

OTHER PUBLICATIONS

"Halbleiterschaltungstechnik", Tietze et al., 12. Springer. 2002, pp. 1009-1011.
"A 240-Mbps, 1-W CMOS EPRML Read-Channel LSI Chip Using an Interleaved Subranging Pipeline A/D Converter", Tatsuji Matsuura, Takashi Nara, Tatsuya Komatsu, Eiki Imaizume, Toshihiro Matsutsuru, Ryutaro Horita, Haruto Katsu, Shintaro Suzumura and Kazuo Sato, IEEE Journal of Solid-State Circuits, vol. 33, No. 11, Nov. 1998, pp. 1840-1850.

* cited by examiner

*Primary Examiner*—Jean Bruner Jeanglaude
(74) *Attorney, Agent, or Firm*—Eschweiler & Associates, LLC

(57) ABSTRACT

A method for converting an analog input signal into a digital value with successive approximation. A first comparison operation is provided before a first approximation, which subdivides a predefined input voltage interval into five partial intervals according to four reference potentials. During the comparison operation, a partial voltage interval determined is used in the ensuing approximation for the selection of a new reference potential pair to be used. This method enables higher sampling rates. At the same time, the range of the input signal is increased.

26 Claims, 5 Drawing Sheets

FIG 6

| | T0 | | T1 | | T2 | | T3 | | T4 | |
|---|---|---|---|---|---|---|---|---|---|---|
| | P0 | C0 | P1 | C1 | P2 | C2 | P3 | C3 | P4 | C4 |
| φ1 | S 0.9 V | S 0.9 V | S 0.9 V | S 0.9 V | | | | | | |
| φ2 | H 0.9 V | D 0.75 V<0.9 V <1 V ⇒ overload | H (overload) 2×0.9 V − 2 Vr = −0.2 V | D (overload) 7/8 Vr<0.9 V <9/8 Vr ⇒ Fuzzy | | | | | | |
| φ3 | | | | | S −0.2 V | S −0.2 V | | | | |
| φ4 | | | | | H (Fuzzy) 2×−0.2 V = −0.4 V | D (Fuzzy) ≤0.2 V< −1/8 Vr ⇒ Low | S −0.4 V | S −0.4 V | | |
| φ5 | | | | | | | H (Low) 2×−0.4 V +Vr=0.2 V | D (Low) −5/8 Vr<−0.4 V <−3/8 Vr ⇒ Fuzzy | S 0.2 V | S 0.2 V |
| φ6 | | ⇒ overload | | ⇒ Fuzzy | | ⇒ Low | | ⇒ Fuzzy | H (Fuzzy) 2×0.2 V =0.4 V | D (Fuzzy) 1/8 Vr< 0.2 V ⇒High ⇒ High |

METHOD FOR CONVERTING AN ANALOG INPUT SIGNAL, AND ANALOG-TO-DIGITAL CONVERTER

REFERENCE TO RELATED APPLICATIONS

This application is a continuation of PCT/DE2004/001587, filed Jul. 21, 2004 which was not published in English, that claims the benefit of the priority date of German Patent Application No. DE 10337042.0, filed on Aug. 12, 2003, the contents of which both are herein incorporated by reference in their entireties.

FIELD OF THE INVENTION

The invention relates to a method for converting an input signal into a digital value by means of successive approximation. The invention furthermore relates to an analog-to-digital converter for converting an analog input signal into a digital value.

BACKGROUND OF THE INVENTION

Analog-to-digital converters are important components in digital signal processing. In this case, analog-to-digital converters convert the voltage of an input signal into a number proportional thereto, which is output as a digital signal. The digital signal is often a serial sequence of a number of bits, the binary value of the sequence representing the proportional number.

The number of bits per digital signal is a measure of its accuracy. An analog-to-digital converter having an accuracy of 8 bits converts an input signal into a binary sequence comprising 8 bits. The total input interval of an analog-to-digital converter is thus decomposed into a total of 256 partial intervals, a binary sequence of numbers comprising 8 bits being assigned to each partial interval beginning with the lowest. The lowest partial interval is assigned the decimal value 0 and the highest partial interval is assigned the decimal value 255.

The method of successive approximation is used in one possibility of realization for an analog-to-digital converter. Said method comprises a plurality of approximation steps, in each step a digital partial value being determined and used for forming the digital total value. In this case, the number of approximation steps corresponds to the binary accuracy of the digital value. A simple embodiment of such a method is described in detail in "Tietze/Schenk, Halbleiterschaltungstechnik [Semiconductor circuitry], 12th edition, Springer, 2002", on page 1009 et seq.

In one variation of this method, an input signal or expediently the voltage of an input signal, in an approximation step, is not compared with one reference voltage or reference potential, but rather with two reference voltages or reference potentials. This involves determining whether the voltage of the input signal is greater or less than the two reference voltages or reference potentials or lies between the two. The two reference voltages or potentials thus subdivide the input interval for this approximation step into a total of three partial intervals, and the comparison determines that one of said three partial intervals in which the voltage of the input signal lies. Depending on the result, a new signal is generated and is used for the ensuing approximation step. Furthermore, each interval is assigned a value which is used for forming the digital output value of the analog-to-digital converter.

In practice, analog-to-digital converters with successive approximation operate in a clocked operating mode and are formed with sample-and-hold devices, each approximation step often being realized by circuits. During a sample phase, the input signals are sampled in the individual stages of the analog-to-digital converter. Signal processing is effected in a hold phase following the sample phase.

Rising clock rates lead to problems, however, in sample-and-hold circuits in the individual approximation stages of the analog-to-digital converter. In particular the sample-and-hold circuits which carry out a comparison of the input signal with the reference signals require time for their decision-making. At low clock rates, a short period of time between the sample phase and the hold phase is sufficient for decision-making, but at high clock rates the period of time is too short and the error rate rises greatly.

In order to prevent this, the comparison circuits of the individual approximation stages have been implemented such that they can make a decision as early as in a preceding time phase. As a result, the comparison circuits have a complete hold phase time for the decision. An analog-to-digital converter with such a "look-ahead technique" is shown in "Matsuura et. al, A 240-Mbps, 1-W CMOS EPRML Read-Channel LSI Chip Using an Interleaved Sub-ranging Pipeline A/D Converter, IEEE Journal of Solid-State Circuits, Vol. 33, No. 11, November 1998, page 1840 et seq.". The major disadvantage of the analog-to-digital converter described therein, however, is its power consumption and its high supply voltage of 3.3 V, which is at odds with the requirement for a lower power consumption and small supply voltage. In addition, the problem of an excessively short period of time for decision-making is not solved completely in the case of this analog-to-digital converter.

A further analog-to-digital converter is described in U.S. Pat. No. 5,861,832. The last approximation stage of the converter therein is formed without additional amplifiers, whereby the current consumption and space taken up are reduced. However, the problem of an error-free conversion remains in this case, too.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

One embodiment of the invention includes a method for converting an analog input voltage signal into a digital value by means of successive approximation which functions in a manner free of errors even at high clock rates. Furthermore, it can provide an analog-to-digital converter which operates even at low supply voltages and high clock rates.

In this case, the conversion method has an initial comparison step which compares the input signal with at least four partial reference potentials and generates a control signal dependent on the comparison. Furthermore, the method comprises a first approximation and at least one second approximation. Each approximation has a comparison operation, during which a signal is compared with two partial reference potentials that form a reference potential pair and during which a control signal is generated depending on the comparison. The first approximation generates an output signal which is derived from the input signal and the control signal of the initial comparison and which is used as a signal for the comparison operation of the at least one second approximation step. The reference potential pair of the comparison operation of the first approximation is determined by the control signal of the initial comparison operation from a set of five reference potential pairs. The reference potential pair used in the second approximation step is chosen from a set of three reference potential pairs by means of the control signal of the approximation preceding the at least one second approximation. Finally, the method comprises forming the digital value from the control signal of the initial comparison operation and the control signals of the first and of the at least one second approximation.

By virtue of the initial comparison, signals having a large amplitude are processed in a manner free of errors and the dynamic range for the input signal is increased. In addition, the control signal of the initial comparison is used to select a reference potential pair from a set of at least five reference potential pairs for the comparison operation of the first approximation. Consequently, a preselection is already made, and the comparison operation of the first approximation thereby acquires enough time for its decision-making. The method according to the invention is therefore particularly suitable even for high clock rates.

An analog-to-digital converter for converting an analog input signal into a digital value comprises an input and a first converter stage connected to the input. The converter stage has a comparison means for a comparison of a signal applied to the input with at least four partial reference potentials and is designed for outputting the signal applied to the input at a first output and for outputting a control signal dependent on the comparison at a second output. The analog-to-digital converter furthermore has at least one second converter stage connected downstream of the first converter stage. The second converter stage contains a means for outputting an output signal to a first output, which is derived from a signal at a signal input of the at least one second converter stage and from a control signal at a control input of the at least one second converter stage. The at least one second converter stage furthermore comprises a comparison means for a comparison of the signal applied to the signal input with two partial reference potentials determined by the control signal applied to the control input, and for outputting a control signal dependent on the comparison to a second output of the at least one second converter stage. In this case, the signal input and the control input of the at least one second converter stage are connected to the first output and to the second output of a converter stage connected upstream of the at least one second converter stage. The analog-to-digital converter contains a logic circuit, which is designed for outputting a digital value from the control signal of the first converter stage and the control signal of the at least one second converter stage.

By virtue of the design of the analog-to-digital converter with a comparison means in each converter stage, a decision about an output signal to be generated by a converter stage is taken as early as in the converter stage connected upstream of the converter stage. At the same time, a preselection about the partial reference potentials used by the comparison means is already made by means of the control signal of the converter stage connected upstream. As a result, a longer period of time is made available to a comparison means for the comparison of the signal at the signal input. Conversely, an analog-to-digital converter according to the invention that is operated in clocked fashion can operate with significantly higher clock rates. The comparison with four partial reference potentials in the first converter stage additionally means that a large input signal is processed in a manner relatively free of errors even at small supply voltages of the analog-to-digital converter. It is therefore possible to reduce the supply voltage and to implement the analog-to-digital converter using current-saving CMOS circuit technology.

One method in accordance with the invention uses voltages instead of potentials. Since a voltage represents the difference between two potentials, the method, with the choice of a single reference potential for all the reference potentials used in the method, can be embodied with the corresponding reference voltages. Assuming that all of the potentials can always be referred to an identical reference potential, it is thus possible for the reference potentials to be replaced by reference voltages. This is expedient particularly when the input signal represents a voltage signal. A potential interval thus becomes a voltage interval.

Furthermore, the at least one second approximation step generates an output signal which is derived from the output signal and the control signal of the preceding approximation step and which is used as a signal for an approximation step succeeding the at least one second approximation step. This is used here for the comparison operation and also for the generation of a further output signal. As a result, the comparison operation in an approximation step is left significantly more time for its decision-making, because the result of the comparison operation is not required until in the ensuing approximation step.

In a further refinement of the invention, three of the at least five reference voltage pairs of the comparison operation of the first approximation step match the three reference voltage pairs of the comparison operation of the at least one second approximation step.

One development is characterized in that for the generation of the derived output signal in the first approximation step and in the at least one second approximation step, the amplitude of the input signal is doubled or the amplitude of the input signal is doubled and an intermediate signal is added to or subtracted from the latter. The intermediate signal is derived from the n-fold value of a first reference potential in the first approximation step or from the first reference potential in the at least one second approximation step. The value n is a natural number greater than 1.

In this context, it is particularly expedient if the first and the second partial reference potential of the reference potential pairs have in each case a fraction of a first reference potential. The fraction here is the m-fold value of the eighth part of the first reference potential or of the first reference voltage, where m is an odd integer from −9 to 9. In one development of this refinement, the two partial reference potentials of the reference potential pairs have a voltage difference of ⅔ of the first reference potential.

In one example, during the initial comparison step, an input potential interval predefined by an upper and a lower limit potential is subdivided into at least five partial potential intervals by means of the at least four partial reference potentials. That one of the five partial potential intervals in which the input signal is situated is determined and a signal dependent thereon is generated. In this context, during the comparison operation of an approximation step as well, a potential interval predefined by two potentials is subdivided into three partial potential intervals. The length of the predefined input potential interval of the initial comparison operation is expediently double the length of the predefined potential interval of an approximation.

The upper or lower limit value of the input potential interval or of the potential interval which is subdivided into partial potential intervals by means of the partial reference potentials is defined by a maximum or minimum value of the signal which is used in this approximation step. However, the two limit values may also be fixedly predefined limit values which are greater or less than the maximum or minimum value of the voltage signal, respectively.

One embodiment involves limiting a partial reference potential of a reference potential pair to the upper or lower limit potential of the predefined input potential interval.

In one embodiment of the analog-to-digital converter, the two partial reference potentials form a reference potential pair, the comparison means of the at least one second converter stage being designed for a choice of a reference potential pair from a set of three or at least five reference potential pairs depending on a control signal applied to the control input.

The analog-to-digital converter has a plurality of cascaded second converter stages, the comparison means of the first second converter stage being designed for a choice of at least five reference potential pairs, and the comparison means of the further second converter stages being designed for a choice of three reference potential pairs.

In one embodiment, the comparison means of the first converter stage of the analog-to-digital converter has an input potential interval for the input signal that is predefined by an upper and a lower limit potential. The at least four partial reference potentials thus subdivide the input potential interval into at least five partial potential intervals. The comparison means is designed for determining the partial potential interval in which the input signal is situated and for outputting a control signal dependent thereon.

In this context, the comparison means of the at least one second converter stage of the analog-to-digital converter has a potential interval for the signal applied to the signal input of the converter stage that is predefined by an upper and a lower potential, and subdivides this into three partial potential intervals by means of the two partial reference potentials of a reference potential pair.

The comparison devices and the generator circuits of the converter stage of the analog-to-digital converter can be designed as sample-and-hold circuits for clocked operation.

In this case, the comparison means of the at least one second converter stage is expediently designed for sampling a signal present at the signal input during a first time period and for comparing the sampled signal with two partial reference potentials of a reference potential pair and for outputting an unambiguous signal dependent on the comparison at the second output during a second time period. In this case, the first time period is designated as the sample phase and the second time period is designated as the hold phase.

The first comparison means of the first converter stage can be designed for sampling an input signal during a first time period and for comparing the sampled input signal with at least four partial reference voltages and for outputting an unambiguous signal dependent on the comparison during a second time period.

It is also possible for the outputting means of the at least one second converter stage to be designed for sampling a signal present at the signal input during a first time period and for outputting an output signal at the first output depending on the sampled signal and also a control signal at the control input. The comparison means thus samples a signal applied to the signal input during the sample phase, that is to say the first time period, and processes said signal during the hold time period.

In one development of the analog-to-digital converter, the second time period of the first converter stage forms the first time period of the second converter stage connected downstream of the first converter stage. The hold phase of a converter stage thus forms the sample phase of a converter stage connected downstream of the converter stage.

In another development of the analog-to-digital converter, the two partial reference potentials of a reference potential pair in a converter stage are formed from in each case a fraction of a first reference potential, the fraction being the m-fold value of the eighth part of said first reference potential and m being an odd integer in the range from −9 to 9. The difference between the two partial reference potentials is ⅔ of the value of the first reference potential.

In one development of the analog-to-digital converter, the value of the first reference potential is equal to the value of half the difference between the lower and upper limit potentials of the input potential interval.

In one refinement of the invention, the first converter stage has a sample-and-hold circuit. The signal input of the first converter stage is connected to the output of a sample-and-hold circuit which is designed for sampling an input voltage signal during the sample phase and for outputting a signal at the output of the first converter stage during the hold phase. In this case, the value of the voltage signal output is equal to the value of the input voltage signal during the sample phase. Possible errors in the conversion of an analog signal into a digital signal can thus be reduced.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

The invention is explained in detail below on the basis of an exemplary embodiment with reference to the drawings.

FIG. 6 shows an exemplary embodiment of the method.

DETAILED DESCRIPTION OF THE INVENTION

Figure 1:
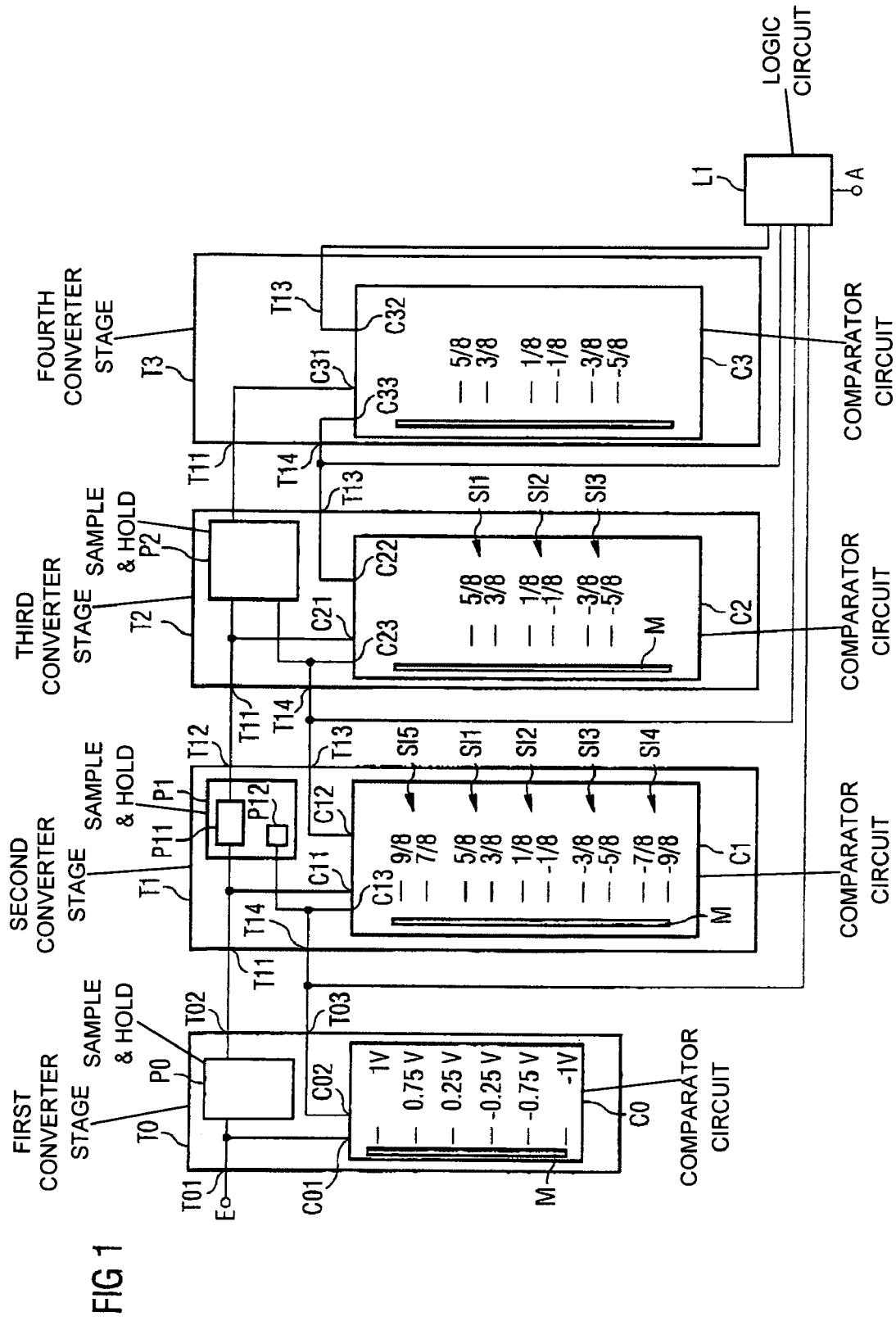
FIG. 1 shows an exemplary embodiment of an analog-to-digital converter.

One or more aspects and/or embodiments of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, known structures and devices are shown in block diagram form in order to facilitate describing one or more aspects of the present invention.

FIG. 1 shows an analog-to-digital converter having an input E and an output A. An analog input voltage signal is fed in at the input E of the analog-to-digital converter, the converted digital value of which input voltage signal can be tapped off at the output A. The converter in this exemplary embodiment uses voltage signals as input signals and voltages for the signal processing within the converter.

The analog-to-digital converter has four converter stages T0, T1 to T3, and also a logic circuit L1. Each converter stage comprises a signal input T01 or T11 and also a control output T03 or T13. The converter stages T1, T2 and T3 have a control input T14 and the converter stages T01, T1 and T2 have a signal output T01 or T12. The converter stages T0, T1 to T3 are cascaded in series, that is to say that their respective signal output is connected to the signal input of the downstream converter stage and their respective control output is connected to the control input of the downstream converter stage. The control outputs T03 or T13 of the respective converter stages T0 to T3 are furthermore connected to the four inputs of the logic circuit L1, the output of which forms the output A of the digital-to-analog converter. The input T01 of the first converter stage T0 forms the input of the digital-to-analog converter.

Figure 5:
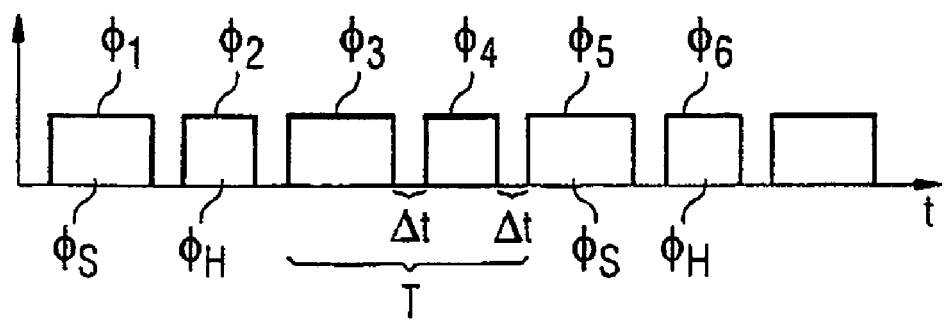
FIG. 5 shows a timing diagram with sample and hold phases.

The analog-to-digital converter shown here is designed for a conversion of an analog input voltage signal in an input voltage interval of −1 V to +1 V into a digital value. The length of the input voltage interval is accordingly 2 V. The analog-to-digital converter operates in a clocked operating mode that alternately has sample and hold phases. The temporal profile of such a sample and hold phase is shown in FIG. 5. Each time period T is subdivided into a sample phase $\Phi_S$ and a hold phase $\Phi_H$. Situated between the sample phase $\Phi_S$ and the hold phase $\Phi_H$ is a small temporal interval $\Delta t$, which is introduced for reducing errors of the sample-and-hold circuits. It serves to make available to the switches in the converter stages T0 to T3 enough time for the switching operation between the sample phase $\Phi_S$ and the hold phase $\Phi_H$.

The converter stage T0 has a sample-and-hold circuit P0, which samples a signal applied to the input of the analog-to-digital converter during a sample phase $\Phi_S$ and outputs the sampled signal at the output T02 of the converter stage T0 during a hold phase $\Phi_H$ of a clock period T. Furthermore, the converter stage T0 has a comparator circuit C0, which is connected by signal input C01 to the input T01 of the converter stage T0 and the output C02 of which forms the control output T03 of the converter stage T0. The comparator circuit C0 has means for providing four partial reference voltages having the values −0.75 V, −0.25 V, 0.25 V and 0.75 V, which subdivide the input voltage interval predefined by the two limit values −1 V and +1 V into five partial voltage intervals. Each of these partial voltage intervals produced is assigned an unambiguous value which can be output as control signal at the output C02. Table 1 shows the individual partial voltage intervals predefined by fixed partial reference voltages and the control signals assigned thereto.

TABLE 1

Partial voltage intervals of the first comparator circuit C0 and assigned control signals

| Partial voltage interval | Control signal | Bit sequence |
|---|---|---|
| 1 V to 0.75 V | "overload" | (0, 0), (0, 1) |
| 0.75 V to 0.25 V | "high" | (1, 0), (0, 0) |
| 0.25 V to −0.25 V | "fuzzy" | (0, 1), (0, 0) |
| −0.25 V to −0.75 V | "low" | (0, 0), (0, 0) |
| −0.75 V to −1 V | "underload" | (0, 0), (1, 0) |

A signal present at the signal input C01 of the comparator circuit C0 is sampled during the sample phase $\Phi_S$ of a clock period T and compared with the four partial reference voltages during the hold phase $\Phi_H$. As a result, a decision is taken as to that one of the five partial voltage intervals in which the voltage value of the signal at the input C01 is situated and the associated control signal is output at the output.

The converter stages T1 and T2 of the analog-to-digital converter each contain a generator circuit P1 and P2, respectively, having a signal input, a control output and a signal output, the signal input of the generator circuit being connected to the input T11 of the respective converter stage and the signal output of the generator circuit being connected to the output T12 of the respective converter stage. The control input of the generator circuit P1 and P2, respectively, leads to the control input T14 of the respective converter stage T1 and T2. The converter stage T3 does not contain a further generator circuit since it constitutes the last approximation stage of the digital-to-analog converter and no further analog voltage signal is required.

The generator circuits P1 and P2 each have a control unit P12, which evaluates a control signal at the control input and, depending on said control signal, performs settings for the circuit P11 for generating the output signal. The generator circuit P1 and P2, respectively, and with them in particular the circuit P11 are likewise designed using sample-and-hold circuit technology. The generator circuit stores the value of the signal applied to the input during the sample phase $\Phi_S$ and generates a new voltage signal, which is output at the output T12 of the converter stage, in the course of the hold phase $\Phi_H$.

Furthermore, the converter stages T1 to T3 each contain a comparator circuit C1 to C3, the control input C13, C23 and C33 of which is connected to the control input T14 of the respective converter stage T1 to T3. A signal input C11 to C31 of the comparator circuits C1 to C3 is connected to the signal input T11 of the respective converter stage T1 to T3. The outputs C12 to C32 of the comparator circuits C1 to C3 form the respective control outputs T13 of the converter stage T1 to T3.

The comparator circuit C1 of the converter stage T1 is designed such that it selects a reference voltage pair from a set of in total five reference voltage pairs SI1 to SI5 depending on a control signal at the control input C13. Each reference voltage pair contains two partial reference voltages which are in each case n/8 of a first reference voltage $V_{ref}$ where n is an odd number. The difference between two partial reference voltages of each reference voltage pair is in each case ⅖ $V_{ref}$. The first reference voltage $V_{ref}$ is 1 V in the exemplary embodiment.

The two partial reference voltages of the selected reference voltage pair actually subdivide the input voltage interval from −1 V to +1 V into three partial voltage intervals. By way of example, in the case of choosing the reference voltage pair (3/8, 5/8), the range is subdivided into the intervals of −1 V to 3/8 V, 3/8 V to 5/8 V and 5/8 V to +1 V. As a result, the length of each partial voltage interval becomes different in magnitude depending on the reference voltage pair chosen. Each partial voltage interval produced by the subdivision is assigned an unambiguous value. An overview of the partial reference voltages of each reference voltage pair and the values assigned to the partial voltage intervals produced can be gathered from Table 2 below.

TABLE 2

Overview of the reference voltage pairs and the partial voltage intervals with the assigned control signals

| Reference voltage pair | Partial voltage intervals [$V_{ref}$] | Control signal | Bit sequence |
|---|---|---|---|
| (7/8, 9/8) | — | — | — |
| | [7/8, 9/8] | fuzzy | (0, 1) |
| | <7/8 | low | (0, 0) |
| (5/8, 3/8) | >5/8 | high | (1, 0) |
| | [3/8, 5/8] | fuzzy | (0, 1) |
| | <3/8 | low | (0, 0) |
| (1/8, −1/8) | >1/8 | high | (1, 0) |
| | [−1/8, 1/8] | fuzzy | (0, 1) |
| | <−1/8 | low | (0, 0) |
| (−3/8, −5/8) | >−3/8 | high | (1, 0) |
| | [−5/8, −3/8] | fuzzy | (0, 1) |
| | <−5/8 | low | (0, 0) |
| (−7/8, −9/8) | >−7/8 | high | (1, 0) |
| | [−9/8, −7/8] | fuzzy | (0, 1) |
| | — | — | — |

In this case, the interval having the larger partial reference voltage as lower limit value contains the assigned value "high", and the interval between the partial reference voltages contains the assigned value "fuzzy" and the interval having the smaller partial reference voltage as upper limit value contains the assigned value "low". Since, in the case of practical embodiment, the voltage value of an input signal at the input C13 can never become greater than 9/8 of the reference voltage $V_{ref}$ or less than −9/8 of the reference voltage $V_{ref}$, the partial voltage intervals assigned thereto with the values "high" and "low" can be obviated. Therefore, if an input signal lies for example between two partial reference voltages of a reference voltage pair determined by the control signal, then the control signal "fuzzy" is always applied to the output T13 of the converter stage independently of the selected reference voltage pair. If the input signal is greater than the larger of the two partial reference voltages, the control signal "high" is generated by the comparator circuit, and if it is less than the smaller of the two partial reference voltages, the control signal "low" is generated. The control signal is used for selecting the reference voltage pair of the downstream comparator circuit or for generating the analog voltage signal in the downstream generator circuit. The selection of a reference voltage pair in the comparator circuit is effected dynamically for each hold phase $\Phi_H$ by means of the control signal of the comparator circuit connected upstream.

Figure 2:
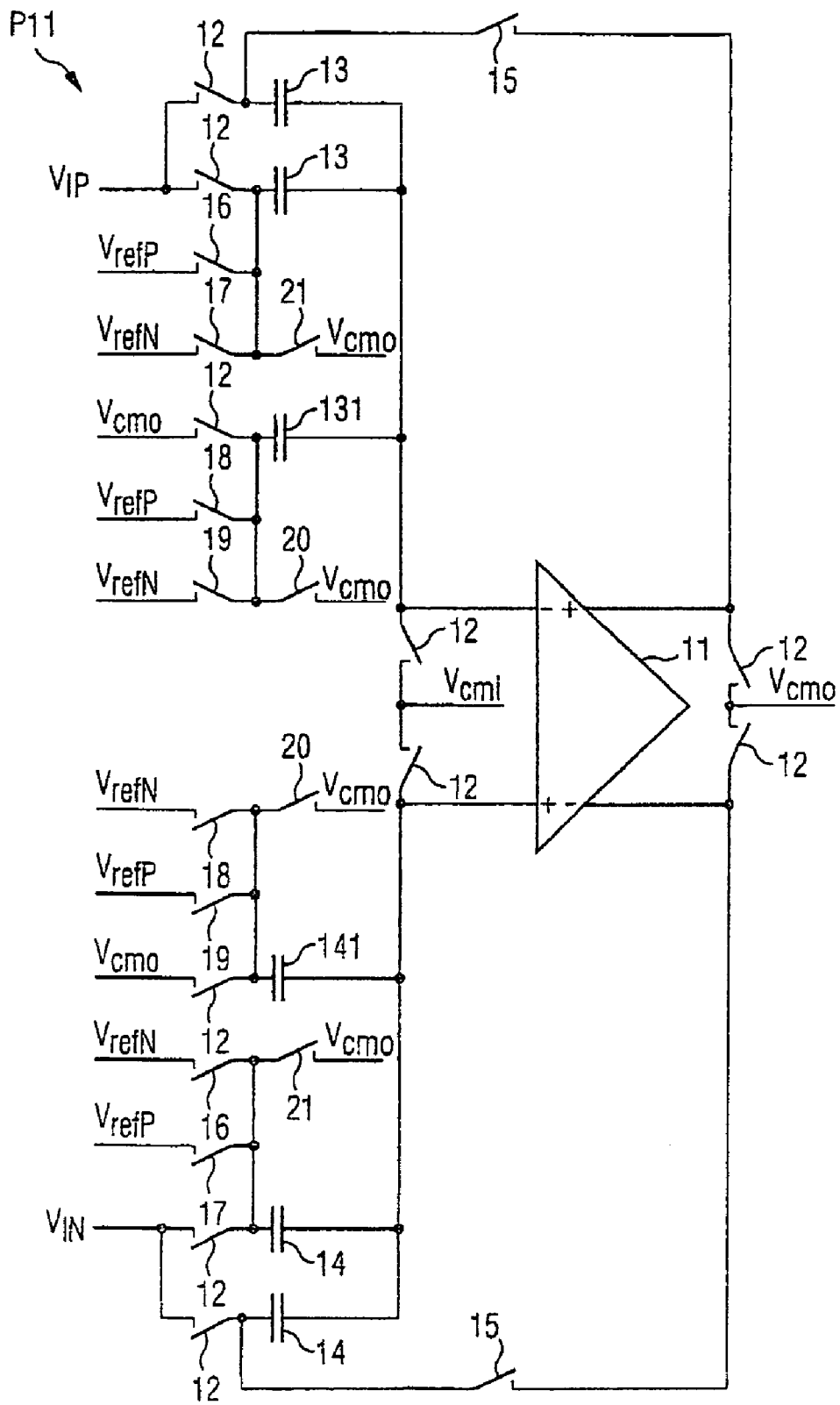
FIG. 2 shows a detail from a generator circuit of a converter stage of the analog-to-digital converter.

FIG. 2 shows a detail from the generator circuit P1. In this case, the circuit P11 is designed as a sample-and-hold circuit for a clocked operating mode and for differential signal processing with two inputs. Each of the inputs carries a part of the differential input signal. However, it is also possible, without relatively high outlay, to realize the generator circuit 11 for asymmetrical signal processing with a single-ended signal input.

The circuit P11 has a differential amplifier 11 having an inverting input "−" and a noninverting input "+" and also an inverting output "−" and a noninverting output "+". The two outputs of the differential amplifier 11 are coupled to a supply potential $V_{CMO}$ via a respective switch 12. The noninverting output of the differential amplifier 11 is connected to a terminal of a first capacitor 13 via a switch 15. This terminal of the first capacitor 13 is coupled to a terminal for an input signal $V_{IP}$ via a further switch 12. The other terminal of the first capacitor 13 is connected to the inverting input of the differential amplifier 11. The inverting input of the differential amplifier 11 is additionally connected to a second capacitor 13, the other terminal of which is coupled to the terminal for a differential input signal $V_{IP}$ via a switch 12, and also to a reference signal $V_{refP}$ via a switch 16, to a reference signal $V_{refN}$ via a switch 17 and to the potential $V_{CMO}$ via a switch 21.

The inverting input "−" of the differential amplifier 11 is furthermore connected to a capacitor 131. The other terminal of the capacitor 131 can be connected to the supply potential $V_{CMO}$ via a switch 12 and 20. Furthermore, this terminal is connected to the reference signal $V_{refP}$ via the switch 18 and to the reference signal $V_{refN}$ via the switch 19.

The inverting input and the noninverting input of the differential amplifier 11 are connected to a supply potential $V_{CMI}$ via a respective switch 12.

The inverting output of the reference amplifier 11 leads via a switch 15 to a terminal of a first capacitor 14 and furthermore via a switch 12 to a terminal for the differential input signal $V_{IN}$. The noninverting input of the differential amplifier 11 is coupled to the other terminal of the first capacitor 14. The noninverting input is additionally connected to a terminal of a second capacitor 14 and also to a terminal of a capacitor 141. The other terminal of the second capacitor 14 leads via a switch 12 to the terminal for the input signal $V_{IN}$, via a switch 21 to the potential $V_{CMO}$, via a switch 17 to the reference signal $V_{refP}$ and via a switch 16 to the reference signal $V_{refN}$. The other terminal of the capacitor 141 is connected to the voltage $V_{CMO}$ via a switch 12 and a switch 20. Furthermore, it is coupled to the reference signal $V_{refP}$ via a switch 19 and to the reference signal $V_{refN}$ via a switch 18.

During the sample phase $\Phi_S$ of a clock period T, the switches 12 of the sample-and-hold circuit P11 are closed and the capacitors 13 and 14 are charged with the voltage of the differential input signals $V_{IN}$ and $V_{IP}$. The switches 12 are opened at the end of the sample phase and during the short intervening time Δt. The voltage of the input signals is now stored in the capacitors. During the hold phase $\Phi_H$, a selection of the switches 16 to 21 are closed depending on the control signal and an output voltage is generated therefrom at the output of the differential amplifier 11. The generated output voltage dependent on the control signal and also the corresponding switch position during the hold phase can be gathered from Table 3. In this case, the $V_I$ is the voltage of the input signal, that is to say the difference between the two voltage signals $V_{IN}$ and $V_{IP}$. The reference voltage $V_{ref}$ results from the two differential reference voltages $V_{refP}$ and $V_{refN}$ and is 1 V.

TABLE 3

Switch position and the output voltage generated therefrom in the generator circuit

| Control signal | Closed switches | Generated output voltage |
| --- | --- | --- |
| "overload" | 17, 19 | $2 * V_I - 2V_{ref}$ |
| "high" | 17, 20 | $2 * V_I - V_{ref}$ |
| "fuzzy" | 20, 21 | $2 * V_I$ |
| "low" | 16, 20 | $2 * V_I + V_{ref}$ |
| "underload" | 16, 18 | $2 * V_I + 2V_{ref}$ |

The output voltage that can be tapped off at the output T12 of the converter stage T1 during the hold phase $\Phi_H$ is sampled during the same phase by the circuit P11 of the generator circuit P2 of the converter stage T2. The sample-and-hold circuit P11 of the generator circuit P2 of the converter stage T2 and all of the downstream generator circuits are formed in a manner similar to the sample-and-hold circuit P11 of the converter stage T1, but the capacitors 131 and 141 and the switches and signal inputs connected to them are absent since the generator circuits P2 do not have to generate output voltages in the case of the control signals "underload" and "overload".

Figure 3:
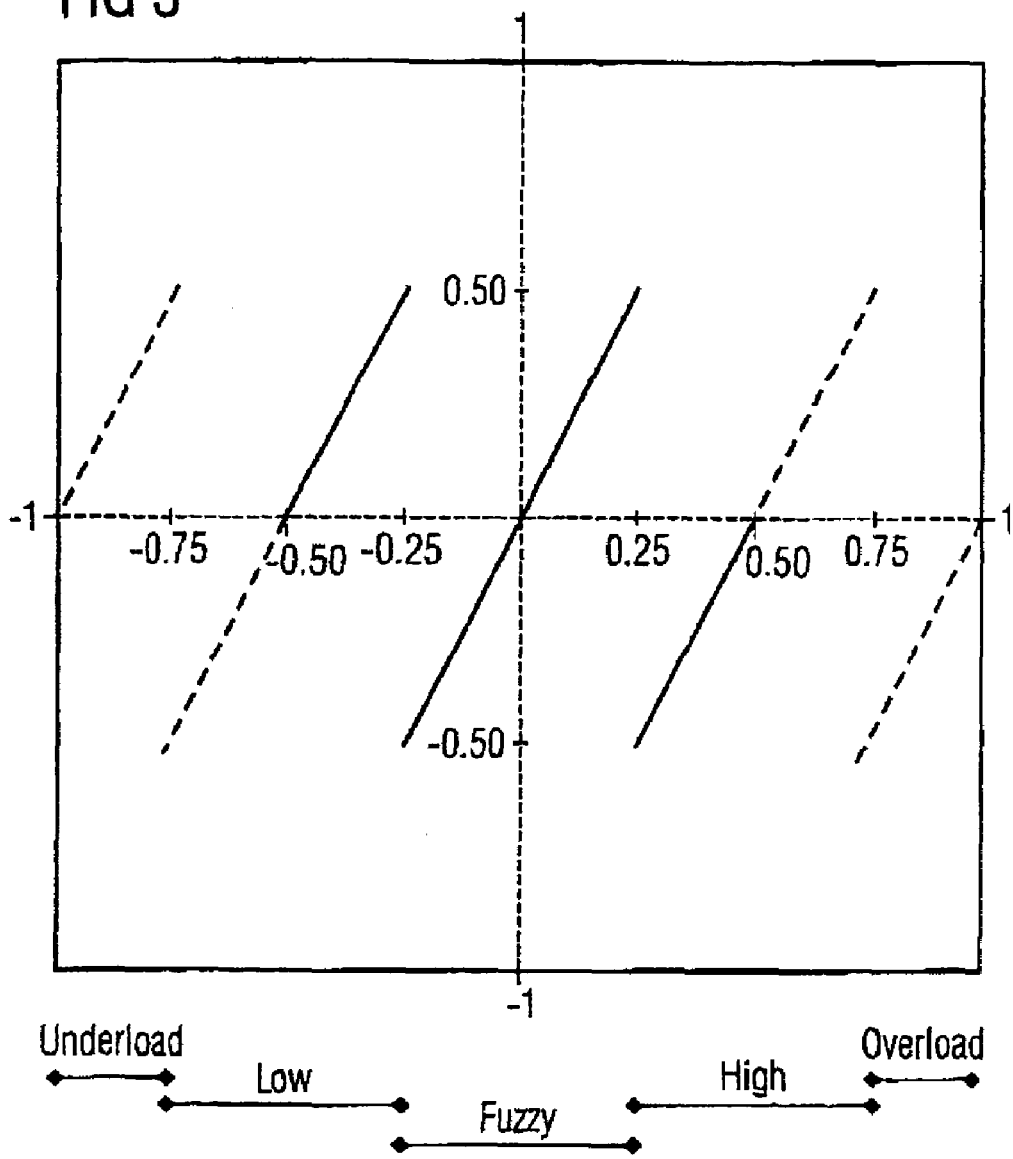
FIG. 3 shows a diagram showing the relationship of the voltages of input signal with respect to output signal.

FIG. 3 shows the relationship between input and output voltage values of the sample-and-hold circuits P11 of the generator circuit P1 and P2, respectively. The input voltage interval on the x axis lies in the range of between −1 and 1 V, and the output voltage generated by the sample-and-hold circuit P11 lies between −0.5 and 0.5 V. The dashed together with the solid line indicates the transfer function of the sample-and-hold circuit P11 of the first generator circuit P1, and the solid lines indicate the transfer function of the sample-and-hold circuit of the generator circuit P2. In particular, an input voltage value in the partial interval identified by "underload" and "overload" is limited by the sample-and-hold circuit P11 of the first generator circuit P1 to the output voltage interval of between −0.5 V and 0.5 V. This is done, as specified in Table 3, by addition and subtraction of twice the voltage reference value $V_{ref}$ to and from double the input voltage if the input signal is situated in the "overload" or "underload" range. In this way, input signals or input voltages are processed by the converter stage T1 in a suitable manner. The downstream generator circuits have a maximum input signal in the range of −0.5 V to 0.5 V. Such an input signal can still be processed without any problems even at supply voltages of around 1 V. The decision as to the partial voltage interval within which the input voltage value lies is taken by the comparator device of the preceding converter stage or by the first comparator device C0.

Figure 4:
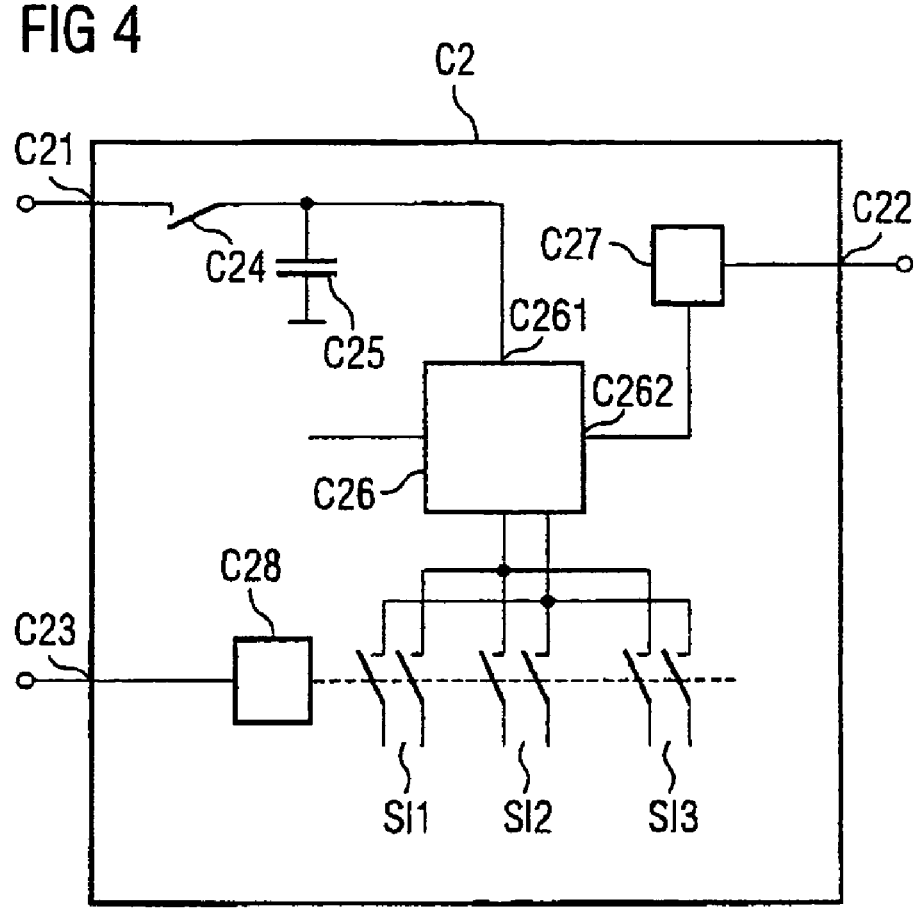
FIG. 4 shows a block diagram of a comparison device.

A block diagram for asymmetrical signal processing of a comparator circuit C2 of the converter stage T2 is illustrated in FIG. 4. The comparator circuit has a switch C24 at its input C21, which switch is coupled to one terminal of a capacitor C25 and also to the input of a comparison circuit C26. The other terminal of the capacitor C25 is connected to the ground potential as reference potential. The comparison circuit C26 has an output C262 leading to a circuit C27, which generates the control signal and outputs it at the control output C22. The comparison circuit C26 furthermore has two inputs for partial reference voltages. Each of said two inputs is connected to three switches. A reference voltage pair can be applied to the inputs for the partial reference voltages by means of two respective switches. A selection as to which pair of switches is closed is made by the circuit C28, which evaluates the control signal at the control input C23 of the comparator circuit C2. Consequently, the circuit C28 connects the inputs for the partial reference voltages to the reference voltage pair SI1, SI2 or SI3 depending on the control signal at the control input C23. In this case, the partial reference voltages −⅜ $V_{ref}$ and −⅝ $V_{ref}$ are present at the two terminals of the reference voltage pair SI1. The terminals of SI2 carry ⅛ $V_{ref}$ and −⅛ $V_{ref}$ and SI3 carries ⅝ $V_{ref}$ and ⅜ $V_{ref}$.

During the sample phase $\Phi_S$, the switch C24 is closed and the capacitor C25 is charged to the input voltage value of the signal at the input C21. In this case, the capacitance of the capacitor C25 is chosen such that it is completely charged during the sample phase $\Phi_S$. In the hold phase $\Phi_H$, the switch C24 is open and one of the switch pairs SI1, SI2 or SI3 is closed depending on the control signal. The comparison circuit 26 compares the voltage value of the capacitor C25 with the partial reference voltages of one of the reference voltage pair selected by the switches SI1, SI2, SI3 and outputs the result at the input C262. Since the input voltage interval at the input C21 is practically limited to the range between −0.5 V and 0.5 V, this interval is subdivided into three or two partial voltage intervals in the comparison device C26 by means of the two partial reference voltages. During the subsequent hold phase, the voltage value stored in the capacitor C25 is compared with the partial reference voltages in the comparison circuit C26. Depending on whether the voltage across the capacitor C25 is greater or less than the partial reference voltages or lies between the latter, that voltage interval within which the voltage value of the capacitor C25 lies is thus determined. The circuit C27 generates therefrom the control signal for the next converter stage and the logic circuit L1.

The comparator circuit C2 of the converter stage T2 in FIG. 2 can be modified into a corresponding comparator circuit C1 in a simple manner. It is likewise easily possible for a person skilled in the art to design the comparator circuit C2 for differential signal processing.

The control signals of the individual comparator circuits C0 to C3 are fed to a logic circuit L1. In this case, the individual control signals correspond to a bit sequence of serial bits which are combined by the logic circuit L1 in FIG. 1 to form a digital value. Expediently, the control signals coming from the comparator circuits C0 to C3 are first converted into bit sequences in the logic circuit L1 and the digital value is determined therefrom in a second step. The logic circuit L1 outputs the digital value at the output A as soon as all the comparator circuits C0 to C3 of the individual converter stages T0 to T3 have supplied a control signal or a bit sequence.

Since the digital-to-analog converter according to the invention operates in a clocked operating mode, the comparator circuit C0 of the converter stage T0 already again generates a control signal with respect to a new input voltage value while the devices C1 to C3 are still supplying control signals with respect to the older input voltages. Therefore, it is necessary for the logic circuit L1 to have a buffer storage unit that buffer-stores control signals and thereby extracted bit sequences of input voltage signals that have not yet been completely processed. Only when an input voltage signal has run through all the converter stages T0 to T3 and been processed does the logic circuit L1 supply the associated digital value. This concept is also called pipelining.

The method of operation of such a digital-to-analog converter shall be demonstrated on the basis of the method example of FIG. 6. In this case, an analog input voltage signal of 0.9 V is intended to be converted into a digital value in a total of eight steps, four of which are shown here.

The digital value is intended to comprise an accuracy of 8 bits. Therefore, a total of seven approximation steps are necessary, each approximation step comprising a comparison operation for an input signal and the generation of a new signal and being performed in one clock period. Each approximation step is carried out in a converter stage of an analog-to-digital converter according to the invention. In addition, the analog-to-digital converter has a converter stage T0, which carries out a comparison operation with a signal at the input of the analog-to-digital converter in one clock period that does not generate a new signal, but rather forwards the input signal unchanged to the next converter stage. An analog-to-digital converter according to the invention which operates with the method according to the invention consequently has eight converter stages, each converter stage carrying out one step.

During a first phase $\Phi_1$, which represents a sample phase $\Phi_S$, both the sample-and-hold circuit P0 of the first converter stage T0 and the comparator circuit C0 of the first converter stage T0 carry out a sampling S of the signal. The sampled analog input voltage signal is 0.9 V. The second phase $\Phi_2$ represents the hold phase $\Phi_H$ for the first converter stage T0. It is simultaneously the sample phase $\Phi_S$ for the converter stage T1 and the generator circuit P1 and comparator circuit C1 thereof. In the time phase $\Phi_2$, the sample-and-hold circuit P0 holds the input voltage signal of 0.9 V and outputs said signal unchanged at the output T02 of the converter stage T0. The generator circuit P1 and the comparator circuit C1 carry out sampling with this input voltage signal. At the same time, the comparator circuit C0 of the converter stage takes a decision D as to the voltage interval within which the input voltage of 0.9 V lies. The input voltage of 0.9 V is greater than 0.7 V, but less than 1 V, and therefore lies in the range of between 0.75 V and 1 V. As can be gathered from Table 1, this is the range identified by the control signal "overload".

The comparator circuit C0 of the converter stage T0 has available to it for its decision-making D the complete time of the second phase $\Phi_2$ and not just the short time period $\Delta t$ between a sample phase $\Phi_S$ and a hold phase $\Phi_H$, since the generator circuit P1 and the comparator circuit C1, which require this information, only sample the input signal during the phase $\Phi_2$.

At the end of the second phase $\Phi_H$, the comparator circuit C0 of the first converter stage T0 sends the control signal "overload" to the generator circuit P1 and the comparator circuit C1 of the converter stage T1. In the third phase $\Phi_3$, the generator circuit P1 generates a new voltage signal in a manner dependent on the control signal "overload" and outputs said voltage signal at the signal output T12 of the first converter stage T1. The voltage signal output is −0.2 V and results from the difference between double the value of the input voltage of 0.9 V−2*$V_{ref}$, where $V_{ref}$ is a reference voltage of 1 V. The generator circuit P2 and the comparator circuit C2 of the converter stage T2 simultaneously carry out a sampling S of the signal of −0.2 V applied to the input T11 of the converter stage T2.

The time phase $\Phi_3$ is simultaneously the time period for a decision-making of the comparator C1. By means of the signal "overload" applied to its control input, the reference voltage pair having the partial reference voltages ⅞ $V_{ref}$ and ⅝ $V_{ref}$ is selected in accordance with Table 2. With these two partial reference voltages, the total input voltage interval between −1 V and +1 V is subdivided into three partial voltage intervals and that one of said three partial voltage intervals within which the voltage value of the signal sampled in the preceding time phase lies is determined. At a reference voltage $V_{ref}$=1 V, ⅞ $V_{ref}$ is less than 0.9 V, which is in turn less than ⅝ $V_{ref}$. Therefore, the voltage value of 0.9 V lies between the two partial reference voltages. As a result, the control signal "fuzzy" is thus produced.

At the end of the time phase $\Phi_3$, the control signal "fuzzy" of the comparator circuit C1 of the converter stage T1 is used for setting the generator circuit P2 of the converter stage T2. As a result, a voltage of −0.4 V is generated and output by the generator circuit P2 at the output T12 of the converter stage T2, which voltage is sampled during the same time phase by the generator circuit P3 and the comparator circuit C3 of the converter stage T3. The middle voltage reference pair having the partial reference voltages −⅛ $V_{ref}$ and +⅛ $V_{ref}$ is simultaneously selected by means of the control signal "fuzzy" in the comparator circuit C2. A comparison of the voltage of −0.2 V sampled in the preceding time phase reveals that this voltage is less than −⅛ $V_{ref}$, that is to say less than −⅛ V. Therefore, the control signal "low" is generated at the end of the time phase $\Phi_4$.

The control signal "low" of the comparator circuit C2 is used in the time phase $\Phi_5$ by the generator circuit P3 of the converter stage T3 for generating a new analog voltage signal and by the comparator circuit C3 of the converter stage T3 for selecting a reference voltage pair comprising the two partial reference voltages −⅜ $V_{ref}$ and −⅝ $V_{ref}$. The comparator circuit once again carries out a comparison and, at the end of the time phase $\Phi_5$, forwards the control signal "fuzzy" to the downstream converter stage T4. This sequence is repeated until all eight converter stages T0 to T7 of the digital-to-analog converter have evaluated the signal. In this case, a control signal is communicated to the logic circuit L1 in each time phase starting from $\Phi_2$, said control signal being converted into a sequence of bits by the logic circuit. The control signals communicated by the comparator circuits C0 to C7 and the partial sequences of bits that are synonymous therewith can be seen in Table 4.

| Stage | Control signal | Bit sequence |
|---|---|---|
| C0 | "overload" | (0, 0), (0, 1) |
| C1 | "fuzzy" | (0, 1) |
| C2 | "low" | (0, 0) |
| C3 | "fuzzy" | (0, 1) |
| C4 | "high" | (1, 0) |
| C5 | "fuzzy" | (0, 1) |
| C6 | "low" | (0, 0) |
| C7 | "fuzzy" | (0, 1) |

A digital number is calculated from these eight bit sequences with the first bit pair in each case. For this purpose, the respective first two bits of each approximation step or of each converter stage are added. However, it must be taken into account that the individual approximation steps and the bit sequences extracted by them have a different significance, which decrease with higher approximation steps or rising converter stage. Beginning at the first two bits (0, 0) of the first bit sequence, upon addition an intermediate value of 00110010+1 results, and hence the decimal value 51. The control signal of the first comparator circuit C0 additionally indicates to the logic circuit that the binary value $2^{M-2}$ has to be added to this value. In this case, M is the number of digits of the binary digital value or the binary accuracy, that is to say 8 in the example. A value of 51+64=115 is thus produced. This is the correct digital result.

By virtue of the formation of a further converter stage T0 upstream of the first converter stage T1 of the digital-to-analog converter, the comparator circuit C1 is given sufficient time for a decision in the time phase $\Phi_3$.

At the same time, by virtue of the formation of the comparator circuit C0 of the converter stage T0, which subdivides the input voltage interval into a total of five partial voltage intervals by means of four differential voltages, whereby the dynamic range of the input voltage interval is increased. Conversely, this means that a supply voltage of the digital-to-analog converter can be reduced without having to accept the disadvantages entailed by an amplification of large input signals at an excessively low supply voltage.

Consequently, in the method, a comparison operation is provided before the actual first approximation step, which effects a decision about the voltage to be set in the first approximation step in a time phase before the first approximation step. As a result, the comparison operation of the first approximation step is afforded significant relief in temporal terms. In addition, the subdivision of the input voltage interval into a total of five partial voltage intervals significantly increases the dynamic range of the input voltages with regard to the supply voltage.

Furthermore, the comparator circuits and the generator circuit can also be realized with reference potentials. Since a voltage only represents the difference between two potentials, in particular the comparison of an input signal with partial reference voltages is a comparison of the input signal with partial reference potentials. The generation of a new signal is also readily possible by addition or subtraction of a potential instead of a voltage.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that features and/or elements depicted herein are illustrated with particular dimensions relative to one another for purposes of simplicity and ease of understanding, and that actual dimensions may differ substantially from that illustrated herein.

LIST OF REFERENCE SYSMBOLS

E: Input
A: Output
T0, T1, T2, T3: Converter stages
T01, T1: Signal input
T02, T12: Signal output
T03, T13: Control output
T14: Control input
P0, P1, P2: Sample-and-hold circuit, generator circuit
C0, C1, C2, C3: Comparator circuit
L1: Logic circuit
C01, C11, C21, C31: Signal input
C02, C12, C22, C32: Control output
C13, C23, C33: Control input
C24: Switch
C25: Capacitor
C26: Comparison circuit
C261, C262: Input, output
C72: Circuit
C28: Switch
SI1, SI2, SI3: Reference voltage pairs
11: Differential amplifier
12, 15, . . . , 21: Switches
13, 14 Capacitors
131, 141: Capacitors
$V_{refP}$, $V_{refN}$: Reference potentials
$V_{IP}$, $V_{IN}$: Input signals
$V_{CMO}$, $V_{CMI}$: Supply voltages
T: Clock period
$\Delta t$: Time period
$\Phi_S$, $\Phi_H$: Sample phase, hold phase
$\Phi_1$ . . . $\Phi_6$: Time phases
$V_{ref}$: Reference voltage

What is claimed is:

1. A method for converting an analog input signal into a digital value comprising:

performing an initial comparison, which compares the input signal with initial partial reference potentials and generates an initial control signal according to the comparison;

performing a first approximation, which compares the input signal with first partial reference potentials and generates a first control signal according to the first approximation;

performing one or more additional approximations, which compare the input signal with additional partial reference potentials and generate one or more additional control signals according to the one or more additional approximations;

performing a final approximation, which compares the input signal with final partial reference potentials and generates a final control signal according final approximation; and generating the digital value according to the initial control signal, the one or more control signals, and the final control signal, wherein at least one of:
the first partial reference potentials, and
the additional partial reference potentials are chosen as a function of an upstream generated control signal.

2. The method of claim 1, the initial partial reference potentials comprising an even number of reference potentials yielding an odd number of initial partial comparison intervals, the first partial reference potentials comprising an even number of reference potentials yielding an odd number of first partial comparison intervals, the additional partial reference potentials comprising respective even numbers of reference potentials yielding respective odd numbers of additional partial comparison intervals, and the final partial reference potentials comprising an even number of reference potentials yielding an odd number of final partial comparison intervals.

3. The method of claim 1, wherein at least one of the first partial reference potentials matches at least one of the initial partial reference potentials.

4. The method of claim 1, wherein performing the first approximation further comprises doubling the input signal.

5. The method of claim 1, wherein performing the first approximation further comprises doubling the input signal and adding or subtracting an intermediate signal, wherein the intermediate signal is derived from a first reference potential or an n-fold value of the first reference potential.

6. The method of claim 1, wherein the initial partial reference potentials are a fraction of a first reference potential.

7. The method of claim 6, wherein the first partial reference potentials have a voltage difference of two eighths of the first reference potential.

8. The method of claim 1, wherein performing the initial comparison further comprises subdividing an input potential interval into at least five partial potential intervals according to the initial partial reference potentials, identifying one of the at least five partial potential intervals in which the input signal is present and generating the initial control signal according to the identified one of the at least five partial potential intervals.

9. The method of claim 8, wherein the initial partial reference potentials are organized in pairs limited to a lower or upper limit value of the input potential interval.

10. The method of claim 1, wherein performing the first approximate further comprises subdividing a first potential interval into at least three partial potential intervals according to the first partial reference potentials, identifying one of the at least three partial potential intervals in which the input signal is present and generating the first control signal according to the identified one of the at least three partial potential intervals.

11. The method of claim 10, wherein the first potential interval corresponds to double a value of the length of a predefined potential interval.

12. The method of claim 1, further comprising employing a common reference potential for performing the initial comparison, the first approximation, the one or more additional approximations, and the final approximation.

13. The method of claim 1, further comprising selecting the first partial reference potentials according to the initial control signal.

14. An analog-to-digital converter comprising:
an input for an analog input signal;
a first converter stage comprising a comparator circuit that compares the analog input signal with first partial reference potentials and outputs an initial control signal according to the comparison and a sample and hold circuit that provides the analog input signal as an initial output signal;
one or more additional converter stages that operate sequentially on the initial output signal to compare the initial output signal to additional partial reference potentials and generate one or more additional control signals and one or more additional output signals, the one or more additional converter stages respectively comprising a comparator circuit; and
a logic circuit that provides a digital value according to the initial control signal and the one or more additional control signals, wherein
one or more of the additional partial reference potentials are chosen as a function of an upstream generated control signal.

15. The converter of claim 14,
the first partial reference potentials comprising an even number of reference potentials yielding an odd number of first partial comparison intervals, and
the additional partial reference potentials comprising respective even numbers of reference potentials yielding respective odd numbers of additional partial comparison intervals.

16. The converter of claim 14, wherein the first converter stage includes an initial potential interval for the input signal and the initial potential interval is subdivided into partial potential intervals according to the first reference potentials.

17. The converter of claim 16, wherein the initial control signal is one of the partial potential intervals.

18. The converter of claim 14, wherein the first converter stage further comprises a sample and hold circuit that holds the input signal and provides the input signal as the initial output signal.

19. The converter of claim 14, wherein the one or more additional converter stages respectively comprise a sample and hold circuit that provides the one or more additional output signals.

20. The converter of claim 14, wherein the comparator circuit samples the input signal during a first time period and compares the sample with the first reference potentials to generate an initial control signal.

21. An analog-to-digital converter comprising:
a first converter stage having a first sample and hold circuit and a first comparator circuit, wherein the first sample and hold circuit holds a sample of the input signal during a first phase of a time period and provides the sample during a second phase of the time period, wherein the first comparator circuit compares the sample to first partial reference potentials to generate a first control signal during the second phase;
a second converter stage downstream from the first converter stage having a second sample and hold circuit and a second comparator circuit, wherein the second sample and hold circuit holds the sample during the first phase and provides the sample during the second phase, wherein the second comparator circuit compares the sample to second partial reference potentials to generate a second control signal during the second phase;
a final converter stage downstream from the second converter stage having a final comparator circuit, wherein the final comparator circuit compares the sample to final partial reference potentials to generate a final control signal during the second phase; and
a logic circuit to generate a digital value for the sample according to at least the first control signal, the second control signal, and the final control signal, wherein
at least one of:
the second partial reference potentials, and
the final partial reference potentials are chosen as a function of an upstream generated control signal.

22. The converter of claim 21,
the first partial reference potentials comprising an even number of reference potentials yielding an odd number of first partial comparison intervals,
the second partial reference potentials comprising an even number of reference potentials yielding an odd number of second partial comparison intervals, and
the final partial reference potentials comprising an even number of reference potentials yielding an odd number of final partial comparison intervals.

23. The converter of claim 21, wherein the final partial reference potentials are selected from a set of possible partial reference potentials according to the second control signal.

24. The converter of claim 21, further comprising a third converter stage downstream from the second converter stage and upstream from the final converter stage having a third sample and hold circuit and a third comparator circuit, wherein the third sample and hold circuit holds the sample during the first phase and provides the sample during the second phase, wherein the third comparator circuit compares the sample to third partial reference potentials to generate a third control signal during the second phase.

25. The converter of claim 21, wherein the first partial reference potentials comprise two pairs of partial reference potentials spaced evenly through a first interval.

26. The convert of claim 25, wherein the first interval is about −1 volt to 1 volt.

* * * * *